United States Patent [19]

Pan et al.

[11] Patent Number: 4,706,102
[45] Date of Patent: Nov. 10, 1987

[54] MEMORY DEVICE WITH INTERCONNECTED POLYSILICON LAYERS AND METHOD FOR MAKING

[75] Inventors: David S. Pan, Doylestown; Kanak C. Sarma, North Wales, both of Pa.; Mark A. Halfacre, Portland, Me.; Alexander H. Owens, Pennington, N.J.; Brian K. Rosier, Jenkintown, Pa.

[73] Assignee: Sprague Electric Company, North Adams, Mass.

[21] Appl. No.: 795,810

[22] Filed: Nov. 7, 1985

[51] Int. Cl.[4] ............ H01L 29/78; H01L 27/02; H01L 29/04; G11C 11/34
[52] U.S. Cl. .................. 357/23.5; 357/41; 357/59; 365/185
[58] Field of Search ............ 357/23.5, 41, 596; 365/185

[56] References Cited

U.S. PATENT DOCUMENTS

| | | | |
|---|---|---|---|
| 4,099,196 | 7/1978 | Simko | 357/23.5 |
| 4,274,012 | 6/1981 | Simko | 357/23.5 |
| 4,300,212 | 10/1981 | Simko | 357/23.5 |
| 4,314,265 | 2/1982 | Simko | 357/23.5 |
| 4,404,577 | 9/1983 | Cranford, Jr. et al. | 357/23.5 |
| 4,422,092 | 12/1983 | Guterman | 357/41 |
| 4,486,769 | 12/1984 | Simko | 357/41 |
| 4,495,693 | 1/1985 | Iwahashi et al. | 29/571 |

Primary Examiner—Martin H. Edlow
Assistant Examiner—Robert P. Limanek

[57] ABSTRACT

A memory device, based upon a field effect transistor having a floating gate is constructed for use in a silicon integrated circuit array of similar memory devices. The memory device includes only two polysilicon layers, a portion of each polysilicon layer being connected to each other through a via hole in an intervening silicon dioxide layer to form the floating gate.

9 Claims, 6 Drawing Figures

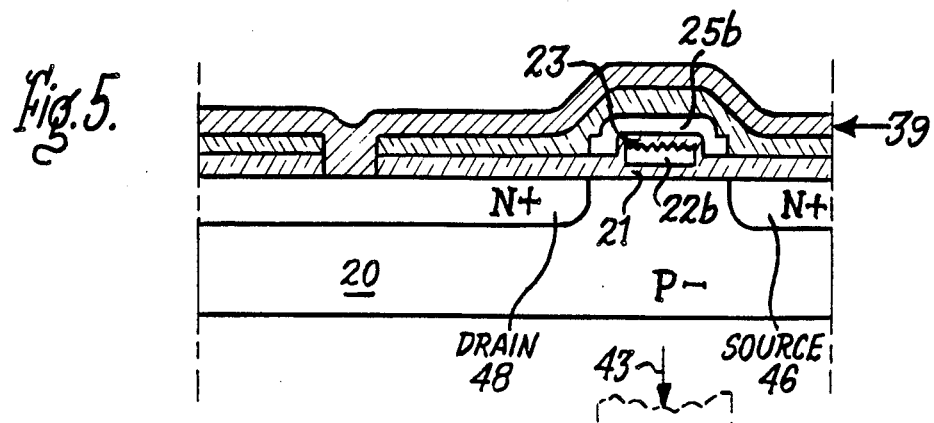
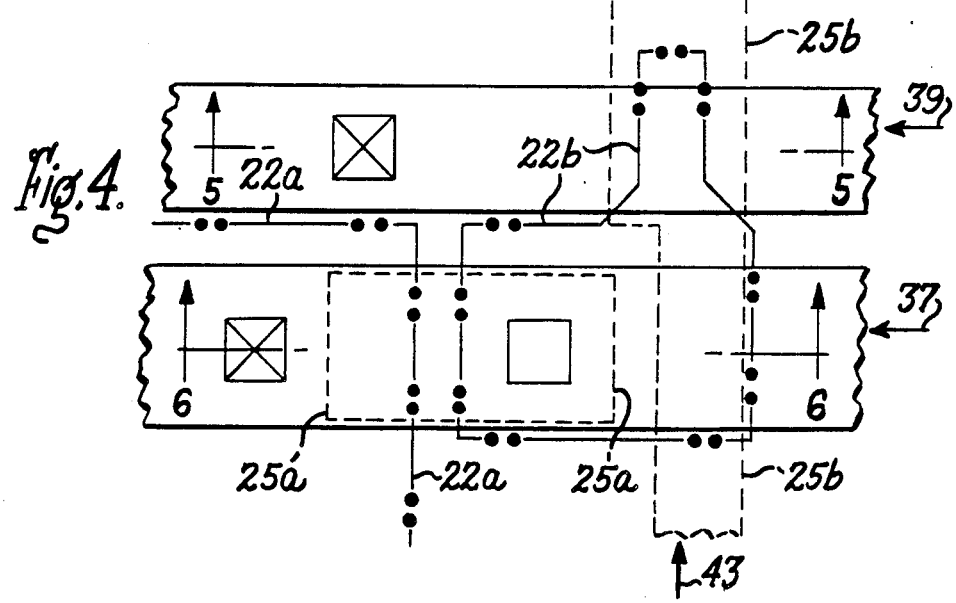
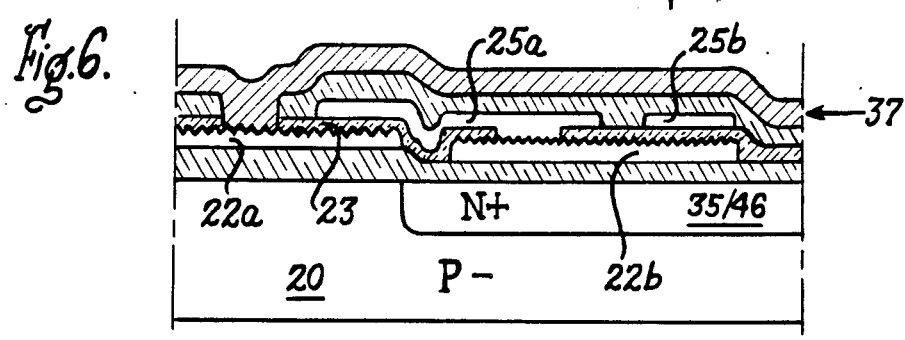

MEMORY DEVICE WITH INTERCONNECTED POLYSILICON LAYERS AND METHOD FOR MAKING

BACKGROUND OF THE INVENTION

This invention relates to non-volatile semiconductor memory devices having a floating gate that is capable of being electrically charged and electrically discharged, and more particularly, to such a memory device having a multilayer system of conductors comprised of two polysilicon layers, portions of which are connected to each other, and at least one metal layer.

An array of such memory devices is sometimes known as an EEPROM or an E²PROM (electrically erasable programable read only memory). The memory device is based on an insulated gate field effect transistor (IGFET) having a floating gate and a control gate. The control gate is typically positioned over and spaced from the floating gate and may have the dual functions of "conditioning" the transistor for "reading" by connection to signals from the "word select" line and at other times conditioning the transistor for being erased, responding to other "word select" line signals.

An especially effective device feature for charging the floating gate (writing) includes a textured "charging" electrode having a capacitive relationship with an extended portion of the floating gate. The surface of the charging electrode facing the floating gate is rough or textured. When a large negative voltage (e.g., 20 volts) is applied to the charging electrode relative to the adjacent floating gate, the latter acquires electrons by tunneling from the textured-surface of the charging electrode. The floating-gate under-surface is usually smooth. The textured and smooth surfaces advantageously provide unidirectional electron emission from the textured charging electrode to the floating gate. It is thought that this is attributable to Fowler-Nordheim tunneling at high field points at peaks in the textured surface.

In a similar manner, for discharging the floating gate and erasing the memory, the adjacent surfaces of the floating gate and the control gate are, respectively, textured and smooth so that for a large negative voltage (e.g., 20 volts) applied to the floating gate relative to the control gate, electrons are conducted away from the control gate by tunneling.

A detailed portion of the prior art memory device structure that is used to implement these programing and erasing functions is illustrated in FIG. 1. On the top surface of semiconductor silicon substrate 10 an insulative layer of silicon dioxide 11 is grown. A first polysilicon layer 12 is deposited in a lower plane 17 over the oxide layer 11 and the top surface is textured by process steps described later herein. Another silicon dioxide layer 13a is grown over the textured top surface of the first polysilicon layer and at the same time more oxide 13b is grown over the uncovered surface of the substrate 10.

A second polysilicon layer 14 is deposited partly in lower plane 17 and partly in an upper plane 18 above the first polysilicon layer 12. Its top surface is then textured. A silicon dioxide layer 15 is grown over the top textured surface of the second polysilicon layer 14.

A third polysilicon layer 16 is deposited in upper plane 18 over a portion of the second polysilicon layer 14.

The second polysilicon layer 14 serves as the floating gate, its lower (right hand portion as shown) being spaced from the channel region (not delineated in FIG. 1) by silicon dioxide layer 13b. The first polysilicon layer 12 is the afore-mentioned charging electrode from which the floating gate 14 received charge at programing. The third polysilicon layer 16 is the afore-mentioned control gate by which, among other functions, stored charge on the floating gate is removed.

Although such prior art devices exhibit many excellent performance characteristics, especially for use in an array, the inevitable stacking and crossing over of the three polysilicon layers and associated insulation layers produces sharp changes in the surface. Since at least one additional conductor, namely a low resistance metal "bit line", is needed, that bit line must be deposited over the irregular surface formed by the three polysilicon layers. Regions of incomplete conductor deposition occur at the sharp changes in the surface leading to opens or potential opens which at least degrade the reliability of the array.

It is an object of this invention to provide a non-volatile memory device retaining the advantages and overcoming the shortcomings of the above-mentioned prior art devices.

It is a further object of this invention to provide such a memory device requiring only one polysilicon layer having a textured surface.

It is yet a further object of this invention to provide such a device wherein the silicon dioxide layer through which tunneling is effected to charge the floating gate is the same layer through which it may be discharged.

It is even a further object of this invention to reduce the number of conductor layers needed for forming an array of such memory devices.

SUMMARY OF THE INVENTION

A semiconductor memory device of the kind having a floating gate includes a semiconducting substrate, first and second co-level conductive polysilicon patches lying adjacent to and spaced from a face of the substrate. The inner and outer surfaces of the first and second patches being smooth and textured, respectively. A contiguous unfurled insulative layer is formed over the patches' outer textured surfaces. A third and fourth conductive co-level polysilicon patches are formed on the contiguous unfurled insulative layer, the third patch overlying the first and extending over and electrically contacting part of the second patch through a via hole provided therefor through the contiguous unfurled insulative layer. The term "unfurled" insulative layer means a layer that does not overlap itself. Furled insulative layers can only be made by two or more formation steps whereas the unfurled insulative layer of this invention is preferably made by one for economy. The thus-contacting second and third polysilicon patches serve as the floating gate. The first and fourth polysilicon patches may serve as the charging (programing) electrode and as the read/discharge (word/erase) control gate, respectively.

The term "co-level" is used here with reference to polysilicon patches that were co-deposited and conform to the surface on which deposited and that would literally be co-planar if the underlying surface on which they were deposited were planar. Co-level polysilicon patches are, of course, always unfurled and cannot overlap each other.

BRIEF DESCRIPTION OF THE DRAWINGS

FIG. 4 shows in a top view a preferred embodiment of a memory device of this invention FIG. 5 shows in cross-sectional view taken in plane 5—5, the memory device of FIG. 4.

FIG. 6 shows in cross-sectional view taken in plane 6—6, the memory device of FIG. 4.

DESCRIPTION OF THE PREFERRED EMBODIMENTS

The term "plane" as used hereinabove in connection with FIG. 1, refers more broadly to a level, albeit possibly undulating, at which a layer of polysilicon is deposited. Since that level may vary upward and downward as a result of variations in the underlying silicon dioxide thickness, to crossovers of underlying polysilicon lines, etc., the term "co-level polysilicon patches" will be used herein to describe polysilicon patches that were simultaneously deposited. Such layers are readily identified, in a cross section of a memory device, by exhibiting identical thicknesses and dopant profiles. Furthermore, they cannot possibly be overlapped.

Figure 2:
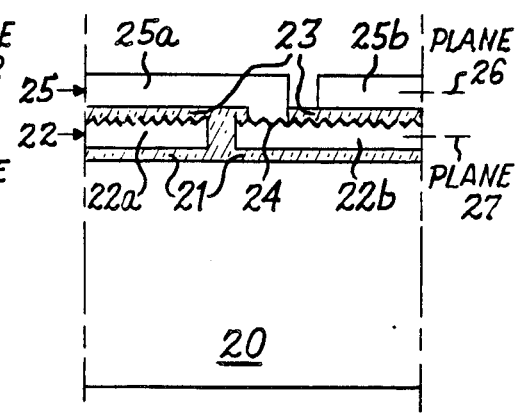
FIG. 2 shows in cross-sectional view a detail of a non-volatile semiconductor memory device of this invention.

Referring to FIG. 2, a semiconductor silicon substrate 20 has grown on a surface thereof by thermal oxidation a high quality silicon dioxide layer 21. A first polysilicon layer 22 is deposited in plane 27 by a standard chemical vapor deposition step on the silicon dioxide layer 21. The co-level polysilicon patches 22a and 22b of that first polysilicon layer 22 are subsequently defined by standard photolithographic masking and etching steps.

The top or outer surface of the first polysilicon layer 22 is textured. This was accomplished by oxidation in dry oxygen of the outer polysilicon surface at a temperature of about 1000° C. These polysilicon oxidation conditions are normally avoided in making multi-level conductors for other devices to avoid the ensuing degradation in dielectric properties including breakdown voltage.

The outer (upper as shown) surface of the silicon dioxide layer 21 on which polysilicon layer 22 is deposited is relatively smooth and, therefore, the inner (lower) surface of the polysilicon layer 22 is smooth compared with the textured outer surface.

A high quality film of silicon dioxide 23 of about 1000 angstroms thickness is grown by thermal oxidation over the textured surfaces of the first and second polysilicon patches 22a and 22b. A hole is made in the silicon dioxide layer 23 at region 24 of the textured surface of polysilicon patch 22b.

A second polysilicon layer 25 is deposited over the first polysilicon layer 22 which is also separated into two co-level polysilicon patches 25a and 25b by standard photolithographic masking and etching steps. Polysilicon patch 25a contacts the surface of the lower patch 22b at region 24 forming a continuously conducting stratum having portion 25a at an upper plane 26 and 22b at a lower plane 27.

Figure 1:
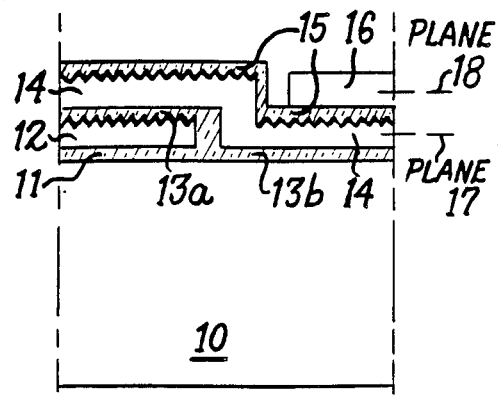
FIG. 1 shows in cross-sectional view a detail of a prior art non-volatile semiconductor memory device.

At first glance, the detail of a memory cell of this invention as depicted in FIG. 2 is quite similar to that of the prior art that is depicted in FIG. 1, and the advantages of one over the other may not be readily apparent. For example, although only the initial polysilicon layer 22 in FIG. 2 is textured while both the initial and subsequent polysilicon layers 12 and 14 in FIG. 1 must be textured in separate steps. But steps for making the via hole in oxide layer 23 are needed for the structure of FIG. 2 and no via holes are required in the prior art structure of FIG. 1.

However, several other and important advantages realized by the new structure of this invention lead to lower manufacturing costs, greater control of performance parameters and higher quality.

Only two polysilicon layers 22 and 25 are deposited by the relatively time consuming and costly CVD process in the new structure of FIG. 2 whereas three polysilicon layers 12, 14 and 16 are required by the prior art. Also, the reduction in process steps leads to a more reliable product.

An especially notable improvement stems from the fact that the oxidation step by which the textured surface of the "charging" electrode is covered is the same oxidation step by which the textured surface of the floating gate is covered. Combining this with the additional fact that the step for texturing the "charging" electrode 22a is the same texturing step by which the floating gate (25a/22b) is textured, it can be appreciated that those two key steps determine the voltage at which tunneling will occur both from the charging electrode 22a to the floating gate portion 25a and from the floating gate portion 22b to the control gate 25b. Thus, optimum programing and erase voltages are always equal to each other, from cell to cell in the same array and from one integrated circuit chip to another.

In memory arrays employing memory devices of the floating gate type it is usual to employ a metal film strip conductor as a sense or "bit" line connecting the memory devices in each row of the array. Bit lines are not shown in either FIGS. 1 or 2. Such a metal bit line would be deposited over earlier formed polysilicon conductors by a low temperature process; i.e., aluminum sputtering process. The relatively high temperature (preferably from 700° C. to 900° C. of the chemical vapor deposition process used for depositing the polysilicon layers must be acccomplished first. The low melting (660° C.) aluminum cannot be put down prior to depositing the polysilicon layers because it would melt and run away during polysilicon deposition. Furthermore, it is convenient and economical to oxidize polysilicon layers to obtain an insulating layer between the polysilicon and metal layers. Aluminum oxide is a poor insulator.

Metal lines, however, are not very tolerant of bumpy or non-planar supporting substrates. Memory arrays of the prior art, employing three layers of polysilicon, present to the subsequently applied metal more severe surface irregularities than do memory arrays including only the two polysilicon conductors of the present invention.

Figure 3:
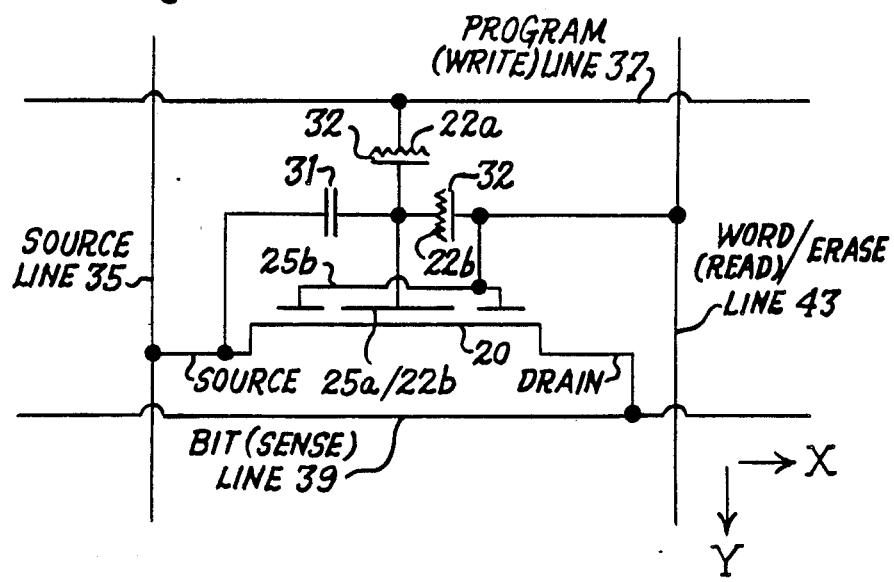
FIG. 3 shows schematically a memory device of this invention with the associated connecting conductors (X and Y lines) that are required for its connection in an integrated circuit memory array.

Referring to the schematic of FIG. 3, the silicon substrate 20 is represented by a line 20 having the floating gate 25a/22b adjacent but spaced away from it and having the control gate 25b overlying the floating gate 25a/22b. The capacitances 31, 32 and 33 that are associated with the floating gate 25a/22b are, respectively, the doped-substrate source line 35, the charging electrode 22a, and the polysilicon control gate 25b. The metal programing line 37 and bit line 39 are oriented in the X direction, and the N-doped and PN-junction-isolated source line 41 located in the substrate 20, as well as the polysilicon word line 43, are in the Y direction.

In FIG. 4 the above-substrate layout of the memory cell conductors is shown, and the sectional views of this cell depicted in FIGS. 5 and 6 show portions of all of the array conductors 35, 37, 39 and 43. The source 46 and drain 48 of the memory transistor are seen in FIG. 5.

In order to enhance the conductivity of the polysilicon layer patches that constitute the charging electrode 22a, the floating gate 22b/25a, the control gate 25b, and the word/erase line 43; the polysilicon is doped preferably with the N-conductivity type dopant, phosphorous, either simultaneously with the deposition of the polysilicon layers or after deposition by other well known doping steps of diffusion or implantation.

What is claimed is:

1. A semiconductor device of the kind having a floating gate that may be electrically charged and electrically discharged comprising:
   a semiconductor silicon substrate;
   first and second co-level conductive polysilicon patches lying adjacent to and spaced from said substrate, the inner and outer surfaces of said first and second co-level polysilcon patches being smooth and textured respectively;
   a contiguous unfurled insulative layer having been formed over said outer textured surfaces of said first and second polysilicon patches; and
   third and fourth co-level conductive polysilicon patches formed on said contiguous insulative layer, said inner and outer surfaces of said third and fourth co-level polysilicon patches being smooth, said third polysilicon patch overlying said first patch and extending over a part of said second polysilicon patch and physically and electrically contacting said second patch through a via hole provided therefor in said contiguous unfurled insulative layer, said hole being spaced from at least one edge of said second patch, said third and second patches having a region of non-contacting overlap at said edge, said contacting-second and third polysilicon patches together being electrically isolated and serving as said floating gate.

2. The memory device of claim 1 additionally comprising a spacing insulative layer having been formed directly on said substrate to space and insulate said substrate from said first and second polysilicon patches.

3. The memory device of claim 1 wherein said contiguous insulative layer is a silicon dioxide layer having been formed by oxidizing said textured surfaces of said first and second polysilicon patches.

4. The memory device of claim 1 that is a field effect transistor additionally comprising a source region and a drain region each of one conductivity type formed in said substrate having been doped with impurities of the other conductivity type.

5. The memory device of claim 4 wherein said source region extends through said device in a Y direction so that when said device is in a column of identified memory devices of an array, each column of said memory devices has Y-extended source regions joined together forming a conductive-column-source line through said array.

6. The memory device of claim 1 wherein said fourth polysilicon patch extends through said device in a Y direction so that when said device is in a column of an array of similar memory devices, each column of said memory devices being identical, each of said devices in said each column has Y-extended fourth polysilicon patches joined together forming a conductive-column-word/erase line through said array.

7. The memory device of claim 1 additionally comprising a metal strip extending through said device in an X-direction and overlying and being spaced from said first, second, third and fourth polysilicon patches except contacting electrically and mechanically a small contact area of said drain region, so that when said device is in a row of an array of similar memory devices, each row of said memory devices being identical, each of said devices in said each row has X-extended metal strips joined together forming a conductive row bit line through said array.

8. The memory device of claim 7 additionally comprising a metal strip extending through said device in an X-direction and overlying and being spaced from said first, second, third and fourth polysilicon patches except contacting electrically and mechanically a small contact area of said first polysilicon patch so that when said device is in a row of an array of similar memory devices, each row of said memory devices being identical, each of said devices in said each row has X-extended metal strips joined together forming a conductive programing line through said array.

9. The memory device of claim 1 wherein said fourth polysilicon patch extends over a portion of said second polysilicon patch to serve as a control gate overlying said floating gate and to provide a collecting electrode for discharging electrons from said textured surface of said floating gate during a memory erase operation.

* * * * *